United States Patent
Shioga et al.

(10) Patent No.: US 7,172,945 B2
(45) Date of Patent: Feb. 6, 2007

(54) METHOD OF MANUFACTURING THIN FILM CAPACITOR

(75) Inventors: Takeshi Shioga, Kawasaki (JP); John David Baniecki, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 173 days.

(21) Appl. No.: 10/974,747

(22) Filed: Oct. 28, 2004

(65) Prior Publication Data

US 2005/0056878 A1 Mar. 17, 2005

Related U.S. Application Data

(62) Division of application No. 10/327,651, filed on Dec. 24, 2002, now Pat. No. 6,853,051.

(30) Foreign Application Priority Data

Dec. 26, 2001 (JP) ............... 2001-394512

(51) Int. Cl.
*H01L 27/13* (2006.01)

(52) U.S. Cl. .............. 438/393; 438/250; 438/396; 257/E21.008

(58) Field of Classification Search ........... 438/396, 438/393, 253, 250

See application file for complete search history.

(56) References Cited

U.S. PATENT DOCUMENTS

| 5,604,145 | A | 2/1997 | Hashizume et al. |
| 5,858,851 | A | 1/1999 | Yamagata et al. |
| 6,278,150 | B1 | 8/2001 | Okudaira et al. |
| 6,509,593 | B2 * | 1/2003 | Inoue et al. ............ 257/295 |
| 6,599,757 | B1 * | 7/2003 | Murai ................. 438/3 |
| 6,617,666 | B2 | 9/2003 | Yoshitomi et al. |
| 6,720,608 | B2 | 4/2004 | Lee |
| 6,747,334 | B2 | 6/2004 | Kitagawa et al. |

* cited by examiner

*Primary Examiner*—Zandra V. Smith
*Assistant Examiner*—Pamela E Perkins
(74) *Attorney, Agent, or Firm*—Westerman, Hattori, Daniels & Adrian, LLP.

(57) ABSTRACT

A thin film capacitor comprising an insulating substrate, a capacitor structure located on the substrate, the capacitor structure having a dielectric layer sandwiched between a lower electrode layer and an upper electrode layer, and conductor members respectively connected to the lower electrode layer and the upper electrode layer, wherein at least the dielectric layer has a side face having a sufficient slope for preventing the short circuit of the upper electrode layer with the lower electrode layer through the conductor member. A method of manufacturing such a thin film capacitor is also disclosed.

9 Claims, 6 Drawing Sheets

METHOD OF MANUFACTURING THIN FILM CAPACITOR

CROSS-REFERENCE TO RELATED APPLICATIONS

The application is a division of prior application Ser. No. 10/327,651, filed Dec. 24, 2002 now U.S. Pat. No. 6,853,051.

This application is based upon and claims the benefit of priority from prior Japanese Patent Application No. 2001-394512, filed on Dec. 26, 2001, the entire contents thereof being incorporated herein by reference.

BACKGROUND OF THE INVENTION

1. Field of the Invention

The invention relates to a thin film capacitor, and particularly to a thin film capacitor capable of stably operating in a high frequency region (GHz band) when used in a digital LSI operating at a high speed.

2. Description of the Related Art

Recent digital LSIS (large-scale integrated circuits), including microprocessors, are designed to have a high speed and a low power consumption. Accordingly, decoupling capacitors (also called bypass capacitors) are required to have an improved performance, the decoupling capacitor suppressing a change in the power supply voltage when an impedance load on an LSI is abruptly changed, to thereby decrease switching noise and to stabilize the operation of the LSI, which operates at a high speed, in the high frequency region.

On a prior wiring circuit board, a chip capacitor, as a decoupling capacitor, is mounted in the vicinity of an LSI chip, for the protection of the LSI due to a change in the power supply voltage and high frequency noise in the circuit board. However, in this case, rerouting the wiring line between the chip capacitor and the LSI chip on the circuit board is necessary and there is an inductance between leads for the rerouting. Accordingly, the effects, which the chip capacitor has on the suppression of the change in the power supply voltage to the LSI operating at a high frequency and the adsorption of high frequency ripple, are reduced.

To suppress the change in voltage, the capacitor is required to reduce an equivalent series resistance (ESR) and an equivalent series inductance (ESL). Particularly, the increase in inductance due to the rerouting of wiring lines affects the high frequency properties of a decoupling capacitor. The reduction in inductance becomes possible by locating a capacitor in the vicinity of an LSL and making as short as possible the rerouted wiring lines from an LSI power supply, and a grounding terminal, to the capacitor. Thus, it has been proposed to achieve a reduction in the noise of a power supply system by forming a dielectric thin-film capacitor on a ceramic circuit board for a reduction in inductance (JP-A-4-211191). It has been also proposed to reduce the inductance by connecting the upper and lower pads for a thin-film type capacitor formed on a supporting substrate having a via hole to an LSI and a circuit board, respectively (i.e., the capacitor is interposed between the LSI and the circuit board on which the LSL is to be mounted) (JP-A-7-176453).

Referring to FIGS. 1A to 1I, a conventional and common method for manufacturing a thin film capacitor will be described. As shown in FIG. 1A, a film for a lower electrode is formed on a base substrate 1 of silicon or the like, and is subjected to a shaping process (patterning by etching) to provide a lower electrode 2 (in the case of a thin film capacitor, the manufacturing of which is described here, the shaping process for the lower electrode is not performed in the region shown in the drawing). A dielectric thin film 3 is formed on the lower electrode 2 (FIG. 1B), and is subjected to a shaping process to form a dielectric layer 3a (FIG. 1C). A film 4 for an upper electrode is then formed (FIG. 1D), and is subjected to a shaping process to form an upper electrode 4a (FIG. 1E). An insulating film 5 is formed, and is then patterned to form openings 6 and 7 communicating with the lower electrode 2 and the upper electrode 4a, respectively (FIG. 1F). Subsequently, a resist pattern 8 is formed on the insulating film 5, as shown in FIG. 1G. By a plating process, a conductor is filled in the openings 6, 7, and pads 9 are then formed (FIG. 1H). After the removal of the resist pattern 8, solder bumps 10 are formed on the pads 9, as shown in FIG. 1I, to provide a thin film capacitor.

This method needs, after the formation of the films for the lower electrode, the dielectric layer and the upper electrode constructing a capacitor, the processes for respectively shaping the formed films, so that the method provides many opportunities for impurities, such as dirt or particles, to be deposited on the interface between the electrode and the dielectric. Accordingly, with this method it is difficult to provide highly reliable thin film capacitors. Furthermore, the multitude of processing steps in the method has been the cause of the prevention of efficient production of capacitors.

SUMMARY OF THE INVENTION

It is an object of the invention to provide a thin film capacitor solving the above problems, and a method of manufacturing the capacitor.

The thin film capacitor of the invention comprises an insulating substrate, a capacitor structure located on the substrate, the capacitor structure having a dielectric layer sandwiched between a lower electrode layer and an upper electrode layer, and conductor members respectively connected to the lower electrode layer and the upper electrode layer, the thin film capacitor being characterized in that at least the dielectric layer has a side face having a sufficient slope for preventing the short circuit of the upper electrode layer with the lower electrode layer through the conductor member.

Such a thin film capacitor can be obtained by a method for manufacturing a thin film capacitor of the invention in which a thin film capacitor is manufactured by forming, on an insulating substrate, a capacitor structure having a dielectric layer sandwiched between a lower electrode layer and an upper electrode layer, and forming conductor members respectively connected to the lower electrode layer and the upper electrode layer, the method comprising, after sequential formation on the insulation substrate of films for the lower electrode layer, the dielectric layer and the upper electrode layer, (a) in the case where there is a conductor member penetrating the lower electrode layer, forming the upper electrode layer, the dielectric layer and the lower electrode layer by patterning the films for the upper electrode layer, the dielectric layer and the lower electrode layer together by an ion milling process, or (b) in the case where there is no conductor member penetrating the lower electrode layer, forming the upper electrode layer and the dielectric layer by patterning the films for the upper electrode layer and the dielectric layer together by an ion milling process, and performing the patterning by an ion milling process so as to afford a slope to the side face of at least the dielectric layer, the slope being sufficient for preventing a short circuit of the upper electrode layer with the lower electrode layer through the conductor member.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

In the invention, to decrease the amount of impurities and particles incorporated in a thin film capacitor and, simultaneously, to reduce the number of processing steps in the manufacture thereof, films for a lower electrode layer, a dielectric layer and an upper electrode layer, which construct a capacitor, are successively formed, and the successive films are processed for shaping together at the lead-out (extension) of the electrodes (the formation of conductor members). The formation of the successive films having no interposed processing for shaping makes continuous operation possible, such as a film formation by a sputtering process in one chamber, for example. By the formation of the films in a continuous operation, occasions for the inclusion of impurities and particles in the capacitor are decreased. Also, by the simultaneous processing for shaping of the films, occasions for the inclusion of impurities and particles in the capacitor are decreased and, coincidentally, the number of steps for the manufacture of the capacitor is decreased so that the manufacture becomes much simpler.

Furthermore, in the ion milling process, which is a dry process, used in the invention, by the use of a slope afforded to the processed side faces of the films for the electrode and dielectric layers of the thin film capacitor at the processing for shaping of the films, not only the lead-out (extension) of the electrodes (the formation of conductor members) is facilitated, but also a short circuit between the upper and lower electrodes through the conductor member, which can be caused by the simultaneous processing for shaping of the films, can be prevented.

When the successive films for the electrode layers and the dielectric layer of the thin film capacitor are simultaneously subjected to a process for shaping (a patterning process), one of the conductor members for the lead-out of the electrodes can be the cause of a short circuit between the upper and lower electrodes unless the processed side faces of the respective films have a significant slope. This is true of the case of both upper and lower electrodes of the capacitor being led out to one side of the capacitor, as well as the case of the upper and lower electrodes being led out to both sides of the capacitor.

Figure 1:
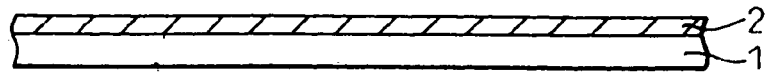
FIGS. 1A to 1I illustrate a conventional and common method for manufacturing a thin film capacitor.
Figure 1:
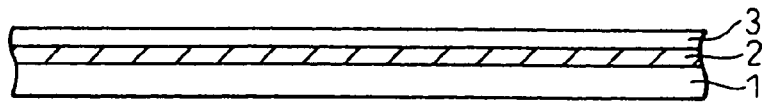
Figure 1:
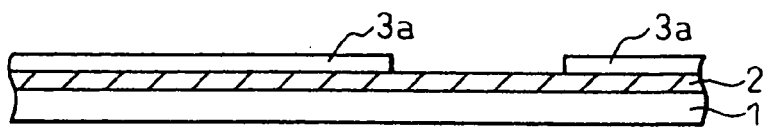
Figure 1:
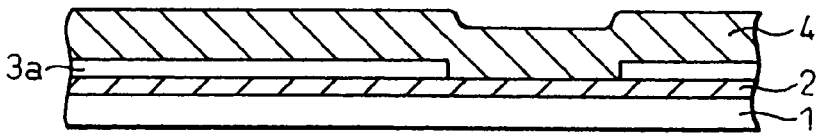
Figure 1:
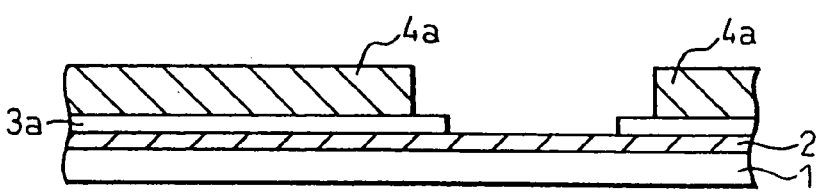
Figure 1:
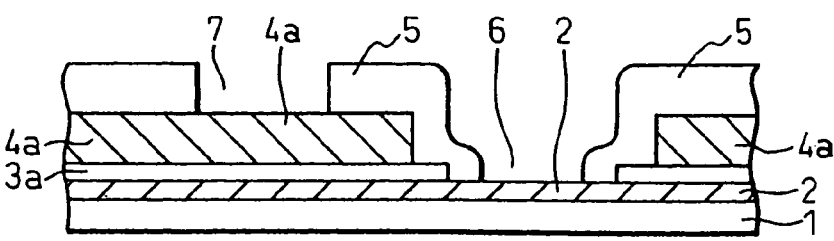
Figure 1G:
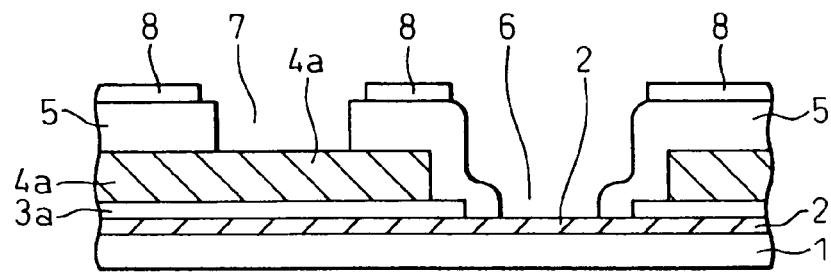
Figure 1H:
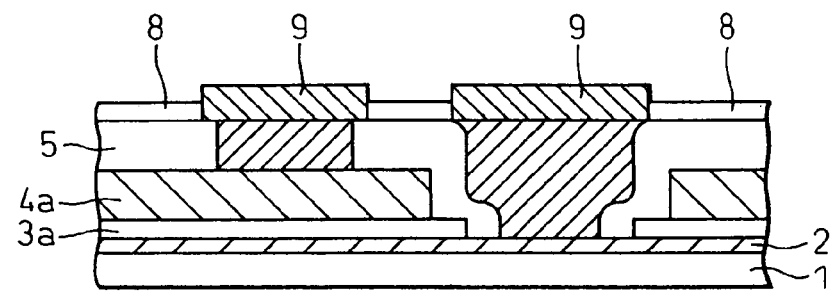
Figure 1I:
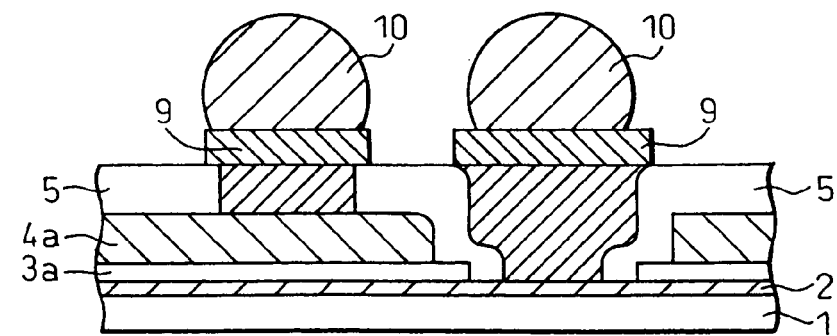
Figure 2A:
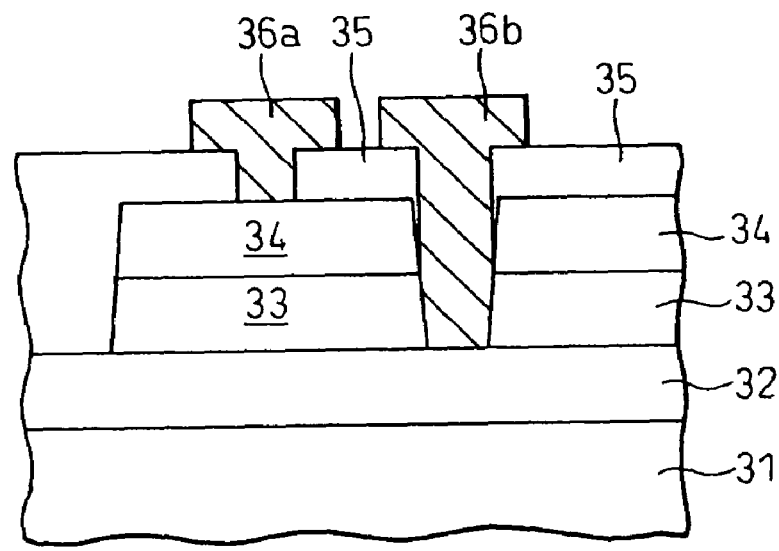
FIGS. 2A and 2B illustrate thin film capacitors obtained by patterning films for electrode layers and dielectric layer together, the capacitors comprising a dielectric layer, which has a side face with no significant slope, and having a possibility of short circuit of an upper electrode layer with a lower electrode layer.

The case of both upper and lower electrodes of a capacitor being led out to one side of the capacitor is described referring to FIG. 2A. The thin film capacitor depicted in the drawing comprises a capacitor structure supported by an insulating substrate 31 and consisting of a lower electrode layer 32, a dielectric layer 33, and an upper electrode layer 34, and conductor members 36a and 36b respectively connected to the upper electrode layer 34 and the lower electrode layer 32 through openings provided in an insulating layer 35. In this thin film capacitor, the conductor member 36b is connected to the lower electrode layer 32 through, in addition to the opening in the insulating layer 35, openings provided in the upper electrode layer 34 and the dielectric layer 33. As shown in the drawing, if the side faces of the upper electrode layer 34 and the dielectric layer 33, which define the side walls of the openings provided in the upper electrode layer 34 and the dielectric layer 33, does not have a significant slope, a process margin in the step of the formation of the opening in the insulating layer 35 becomes small, leading to a decrease in accuracy of alignment for the opening formation, and the extreme proximity of the side wall of the opening in the insulating layer 35 to the side face of the upper electrode layer 34. As a result, the conductor member 36b connected to the lower electrode layer 32 is made susceptible to contact with the upper electrode layer 34 in the vicinity of the side face of the upper electrode layer 34, whereby the upper electrode layer 34 is made susceptible to a short circuit with the lower electrode layer 32.

Figure 2B:
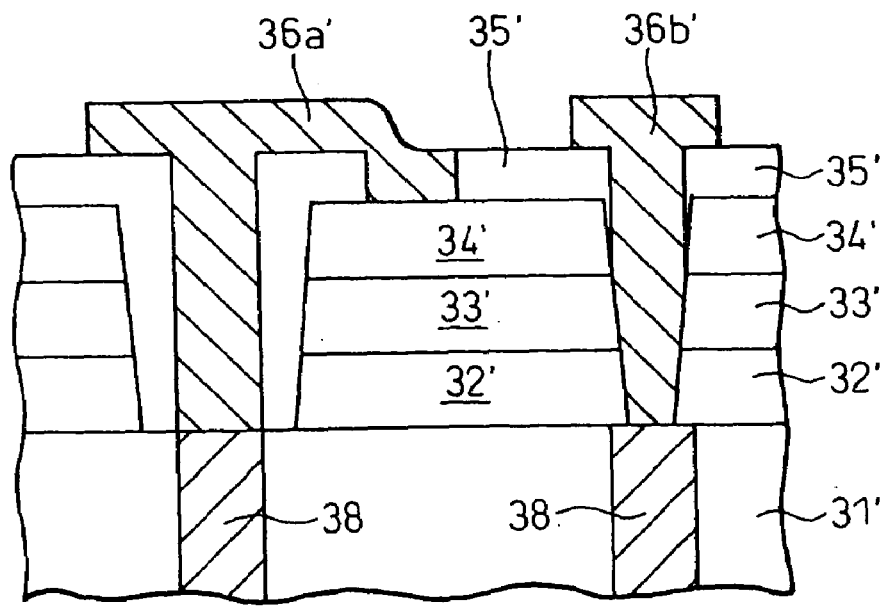

The same is true of the case of upper and lower electrodes being led out to both sides of a capacitor, which is shown in FIG. 2B. The thin film capacitor depicted in the drawing comprises a capacitor structure supported by an insulating substrate 31' (which has via holes piercing through it and filled with a conductor 38) and consisting of a lower electrode layer 32', a dielectric layer 33', and an upper electrode layer 34', and conductor members 36a' and 36b' respectively connected to the upper electrode layer 34' and the lower electrode layer 32' through openings provided in an insulating layer 35', the conductor members 36a' and 36b' being connected to the conductors 38 in the substrate 31'. Also in this thin film capacitor, as shown in the drawing, it can be seen that the conductor member 36b' connected to the lower electrode layer 32' is made susceptible to contact with the upper electrode layer 34' in the vicinity of the side face of the upper electrode layer 34', so that the upper electrode layer 34, is made susceptible to a short circuit with the lower electrode layer 32'.

Figure 3A:
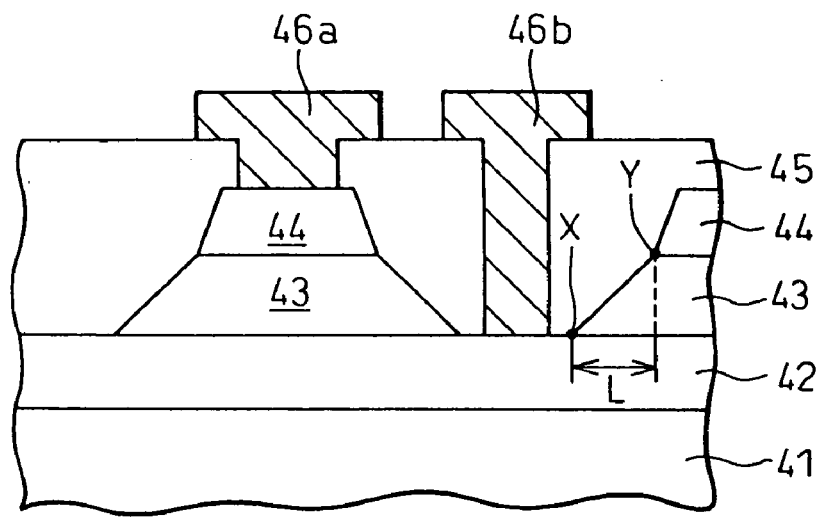
FIGS. 3A and 3B illustrate thin film capacitors obtained by patterning films for electrode layers and dielectric layer together, the capacitors comprising a dielectric layer, which has a side face with a significant slope, and having no possibility of short circuit of an upper electrode layer with a lower electrode layer.

The danger of short circuit of the upper electrode layer with the lower electrode layer through the conductor member for the lead-out of the electrode can be avoided by imparting a slope to the side face of the dielectric layer according to the invention. Referring to FIG. 3A, which shows a thin film capacitor in which upper and lower electrodes are led out to one side of the capacitor, the thin film capacitor depicted in the drawing is made up of members similar to the members illustrated in FIG. 2A, and they are represented by numbers increased by 10 from the numbers allotted to the similar members depicted in FIG. 2A. The difference from the thin film capacitor shown in FIG. 2A is that the thin film capacitor in FIG. 3A has a dielectric layer 43 having a greatly inclined side face. For this reason, a conductor member 46b connecting to a lower electrode layer 42 can leave a sufficient distance from the side wall of an upper electrode layer 44, as shown in the drawing, and, as a result, the danger of short circuit of the upper electrode layer 44 with the lower electrode layer 42, through the conductor member 46b, can be avoided.

Figure 3B:
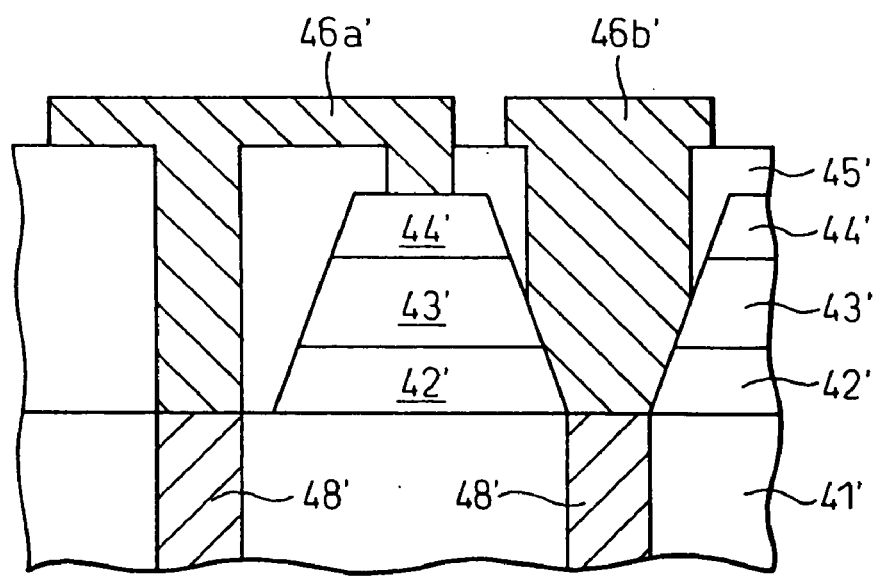
Figure 4:
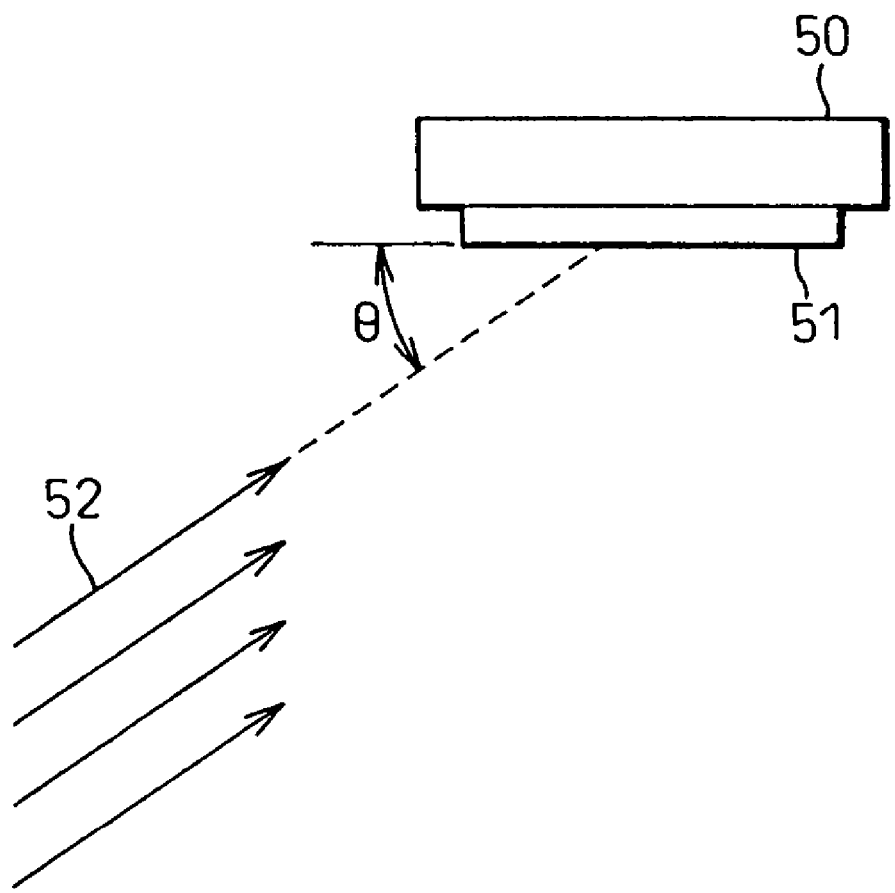
FIG. 4 shows a plasma irradiation angle to a treated substrate.

Referring to FIG. 3B, which shows a thin film capacitor in which upper and lower electrodes are led out to both sides of the capacitor, this thin film capacitor is also made up of members similar to the members illustrated in FIG. 2B, and they are represented by numbers increased by 10 from the numbers allotted to the similar members depicted in FIG. 2B. That is the thin film capacitor depicted in the drawing comprises a capacitor structure supported by an insulating substrate 41' (which has via holes piercing through it and filled with a conductor 48') and consisting of a lower electrode layer 42', a dielectric layer 43', and an upper electrode layer 44', and conductor members 46a' and 46b' respectively connected to the upper electrode layer 44' and the lower electrode layer 42' through openings provided in an insulating layer 45', the conductor members 46a' and 46b' being connected to the conductors 48' in the substrate 41'. Also, in this case, the difference from the thin film capacitor shown in FIG. 2B is that the thin film capacitor in FIG. 3B has a dielectric layer 43' having a greatly inclined side face. Accordingly, a conductor member 46b' connecting to a lower electrode layer 42' can leave a sufficient distance from the side wall of an upper electrode layer 44', and the danger of a short circuit of the upper electrode layer 44' with the lower electrode layer 42' through the conductor member 46b' can be avoided.

To avoid a short circuit of the upper electrode layer with the lower electrode layer through the conductor member, it is sufficient that at least the dielectric layer has a side face having a sufficient slope for avoiding a dangerous proximity of the conductor member connecting to the lower electrode layer to the side face of the upper electrode layer located on the dielectric layer. If as this condition is satisfied, the slope of the side faces of the upper electrode layer and the lower electrode layer (in the case of the conductor member penetrating this layer) may be different from the slope of the dielectric layer, as seen in FIG. 3A, or may be the same as the slope of the dielectric layer, as seen in FIG. 3B. Also, if as that condition is satisfied, the conductor member connecting to the lower electrode layer may be in contact with part of the side face of the dielectric layer, as seen in FIG. 3B.

To avoid the dangerous proximity of the conductor member connecting to the lower electrode layer to the side face of the upper electrode layer, it is preferred, in general, that a horizontal distance between the end of the base of the dielectric layer opposed to the conductor member (which corresponds to the point of the dielectric layer closest to the conductor member, and represents point X in FIG. 3A) and the end of the upper bottom of dielectric layer (which corresponds to the point of the dielectric layer farthest from the conductor member, and represents point Y in FIG. 3A) is no smaller than 3 micrometers, the horizontal distance representing L in FIG. 3A.

The method for manufacturing a thin film capacitor of the invention will now be described.

First, films for an lower electrode layer, a dielectric layer and an upper electrode layer are formed in sequence on an insulating base substrate. As the insulating base substrate, a glass substrate, a sapphire substrate, a silicon substrate having a surface on which an $SiO_2$ film is formed, or the like may be used. In the case of a capacitor in which upper and lower electrodes are led out to one side of the capacitor, a substrate having no through hole is used. In the case of a capacitor in which upper and lower electrodes are led out to both sides of the capacitor, a substrate having through holes in which a conductor is filled is used. Each of the films for electrode layers can be made of platinum, gold, copper, palladium, ruthenium or ruthenium oxide, iridium or iridium oxide, or the like. The films for the upper and lower electrode layers may be made using different materials. The film for the dielectric layer can be made of an oxide or compound oxide containing at least one of strontium, barium, lead, zirconium, bismuth, tantalum, titanium, magnesium and niobium. The films for electrode and dielectric layers may be formed by any film formation process. For example, using a sputtering process, the formation of the respective films can be successively carried out in the same chamber, which is more favorable for the solution of the problem of the generation of particles during the film formation process.

The respective films are then patterned successively by a dry process based on ion milling using a resist pattern formed on the film for upper electrode layer as a mask, to thereby form openings exposing, at their bottom, the lower electrode layer (in the case of a capacitor having the upper and lower electrodes led out to one side of a capacitor), or the through hole vias (in the case of a capacitor having the upper and lower electrodes led out to both sides of the capacitor). For example, when Ar ion milling is used in the dry process, highly reliable patterning can be effected by irradiating the surface of a substrate 51 to be processed placed on a holder 50 with an Ar ion beam 52 at an irradiation angle θ of no more than 45 degrees. By varying the irradiation angle, the angle of slope of the side faces of the electrode and dielectric layers can be changed. In the case where the lower electrode layer is exposed at the bottoms of the patterned openings, i.e., the case where the patterning by the ion milling is intended to be terminated at the top of the film for the lower electrode layer, the patterning can be carried out without affecting properties of a capacitor by the use of a film for the lower electrode layer having a larger thickness than that of a film for the upper electrode layer.

Subsequently, a thin film capacitor can be obtained by forming an insulating layer having openings for conductor members connecting to the respective electrode layers, and forming the conductor members.

EXAMPLES

The following examples further illustrate the invention, although the invention is not limited thereto.

Example 1

Via holes of 60 micrometers in diameter were formed in a glass substrate at a 150 micrometers pitch by a dry etching process using $CF_4$ gas. An insulating film of $SiO_2$ was deposited on the inner walls of the resultant via holes by a CVD process, after which a conductor (Pt) was filled in the via holes to prepare a substrate with through holes.

Figure 5A:
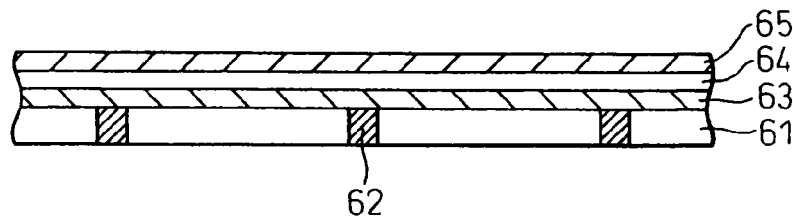
FIGS. 5A to 5D illustrate the manufacture of the thin film capacitor in Example 1.

As shown in FIG. 5A, on the glass substrate 61 thus prepared having the conductor 62 filled in the via holes therein, successive films of $TiO_2$ (0.05 micrometer) and Pt (0.2 micrometer), as materials for a lower electrode were formed by a sputtering process, to provide a film 63 for the lower electrode layer. The $TiO_2$ sputtering was carried out at room temperature, being followed by annealing at 650° C. At the subsequent Pt sputtering, the substrate was at a temperature of 550° C. In the same vacuum system, a film of (Ba, Sr)TiO₃ (hereinafter called BST) of a high dielectric constant material was then formed by sputtering, to provide a film 64 for a dielectric layer. The sputtering was carried out at a substrate temperature of 650° C., an Ar/O₂ gas ratio of 30:4, a pressure of 10 mTorr (1.3 Pa), and an applied RF power of 100 watts, to provide a BST film with a relative dielectric constant of 500. On the BST film, a film of Pt (0.2 micrometer) was formed by sputtering at a substrate temperature of 300° C., to provide a film 65 for an upper electrode layer.

Figure 5B:
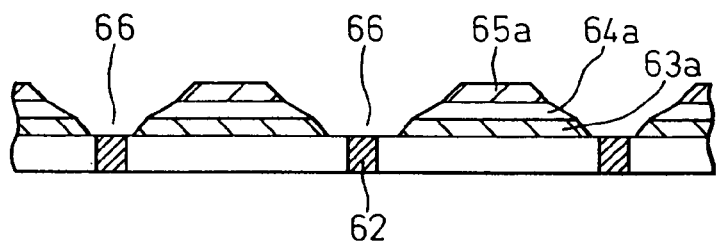

A resist pattern (not shown) was then formed on the film 65 for an upper electrode layer by a photolithography process, and the film 65 for an upper electrode layer, the film 64 for a dielectric layer, and the film 63 for a lower electrode layer were dry-etched together using Ar ion milling, to thereby form openings 66 defined by the side walls of the three films having an angle of inclination, and simultaneously form an upper electrode layer 65a, a dielectric layer 64a, and a lower electrode layer 63a, as shown in FIG. 5B. The substrate 62 was then irradiated with an Ar ion beam at an angle of 20 degree to the substrate.

Figure 5C:
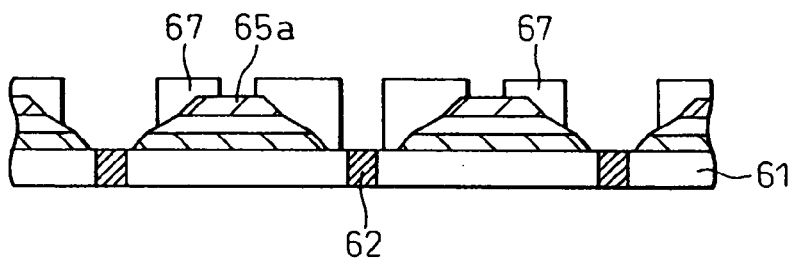
Figure 5D:
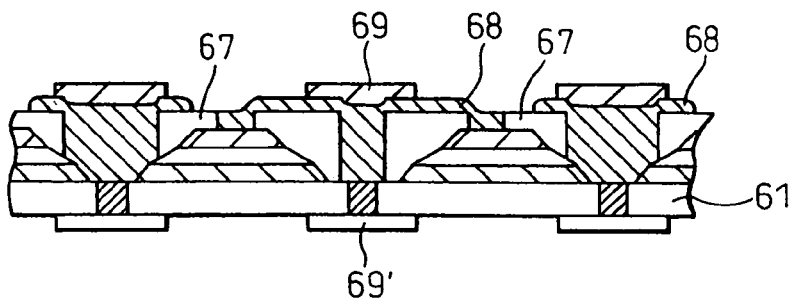

As illustrated in FIG. 5C, a patterned insulating film 67 of polyimide was then formed. Subsequently, as shown in FIG. 5D, conductor members 68 of copper were formed, and surface pads 69 and 69' made up of a lamination of a 0.05 micrometer thick Cr film, a 2 micrometers thick Ni film and a 0.2 micrometer thick Au film were formed on the capacitor face and the substrate face, respectively, to obtain thin film capacitors.

Example 2

Thin film capacitors were fabricated in the same manner as in Example 1, except that the formation of BST dielectric film 64 (FIG. 5A) was done using a sol-gel process.

The formation of BST dielectric film was carried out as follows. A preliminarily fired film having a certain thickness was obtained by repeating two times a series of procedures in which a coated film of about 100 nanometers thick was prepared from a starting solution for BST containing three alkoxides each having one of metal elements Ba, Sr and Ti by a spin coat process (2000 rpm, 30 seconds), and was dried at 120° C. and provisionally fired at 400° C. The preliminarily fired film was then finally fired in earnest at 650° C., to thereby crystallize the BST to provide the film 64 for a dielectric layer.

Example 3

A substrate with through holes was prepared by forming via holes having a diameter of 50 micrometers in a 0.2 millimeter thick sapphire substrate at a 200 micrometers pitch by a laser beam, and filling a conductor (Pt) in the via holes by an MOCVD process. Using this substrate, thin film capacitors were fabricated as in Example 1.

As described, according to the invention, there can be provided a thin film capacitor having improved reliability because it can be manufactured by simultaneously patterning all films constructing the capacitor (films for electrode layers and a film for a dielectric layer), and not separately patterning the layers with each formation of one of the films for electrode and dielectric layers, which can be the cause of inclusion of impurities and particles in the films. In addition, the simultaneous patterning of the films makes the successive formation of the films possible and, accordingly, can contribute to the improvement of a production efficiency of thin film capacitors.

The thin film capacitor having improved reliability, of the invention, is suitable to be used for the application for which particularly high reliability is needed, such as a decoupling capacitor used for the protection of an LSI.

The invention claimed is:

1. A method for manufacturing a thin film capacitor, in which a thin film capacitor is manufactured by forming, on an insulating substrate, a capacitor structure having a dielectric layer sandwiched between a lower electrode layer and an upper electrode layer, and forming conductor members respectively connected to the lower electrode layer and the upper electrode layer, the method comprising, after the sequential formation on the insulation substrate of films for the lower electrode layer, the dielectric layer and the upper electrode layer,
   (a) in the case where there is a conductor member penetrating the lower electrode layer, forming the upper electrode layer, the dielectric layer and the lower electrode layer by patterning the films for the upper electrode layer, the dielectric layer and the lower electrode layer together by an ion milling process, or
   (b) in the case where there is no conductor member penetrating the lower electrode layer, forming the upper electrode layer and the dielectric layer by patterning the films for the upper electrode layer and the dielectric layer together by an ion milling process,
   and performing the patterning by an ion milling process so as to afford a slope to the side face of at least the dielectric layer, the slope being sufficient for preventing the short circuit of the upper electrode layer with the lower electrode layer through the conductor member.

2. The method of claim 1 wherein, during the patterning by an ion milling process, a slope is afforded to the side face of the dielectric layer so that a horizontal distance between the end of the base of the dielectric layer opposed to the conductor member connected to the lower electrode layer and the end of the upper bottom of the dielectric layer is no smaller than 3 micrometers.

3. The method of claim 1 wherein, during the patterning by an ion milling process, the surface of the substrate provided with the films to be patterned is irradiated with an ion beam at an irradiation angle to the surface of no more than 45 degree.

4. The method of claim 1 wherein the dielectric layer is formed of a material selected from the group of oxides and compound oxides containing at least one of strontium, barium, lead, zirconium, bismuth, tantalum, titanium, magnesium and niobium.

5. The method of claim 1 wherein the upper and lower electrode layers are formed of a material selected from the group of platinum, gold, copper, palladium, ruthenium and ruthenium oxide, and iridium and iridium oxide.

6. The method of claim 5 wherein the upper and lower electrode layers are formed of the same material.

7. The method of claim 5 wherein the upper and lower electrode layers are formed of different materials.

8. The method of claim 1 wherein the films for the lower electrode layer, the dielectric layer and the upper electrode layer are successively formed in the same apparatus.

9. The method of claim 1 wherein, as the insulating substrate, a glass substrate, a sapphire substrate, or a silicon substrate having a surface on which an SiO₂ film is formed, is used.

* * * * *